US008723528B2

(12) United States Patent  (10) Patent No.: US 8,723,528 B2
Ketchen et al. (45) Date of Patent: May 13, 2014

(54) ACTIVE 2-DIMENSIONAL ARRAY STRUCTURE FOR PARALLEL TESTING

(75) Inventors: Mark B. Ketchen, Hadley, MA (US); Manjul Bhushan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 13/104,544

(22) Filed: May 10, 2011

(65) Prior Publication Data

US 2012/0286796 A1 Nov. 15, 2012

(51) Int. Cl.
*G01R 31/02* (2006.01)

(52) U.S. Cl.
USPC ..................... 324/537; 324/762.09

(58) Field of Classification Search
USPC ......................... 324/762.01–762.1
See application file for complete search history.

(56) References Cited

U.S. PATENT DOCUMENTS

| | | | |
|---|---|---|---|
| 7,518,393 B2 * | 4/2009 | Shirasaki et al. | 324/760.01 |
| 2007/0057684 A1 * | 3/2007 | Chong et al. | 324/754 |
| 2007/0164769 A1 * | 7/2007 | Gebara et al. | 324/765 |
| 2007/0200587 A1 * | 8/2007 | Doong | 324/765 |
| 2008/0270064 A1 * | 10/2008 | Bhushan et al. | 702/119 |
| 2011/0050273 A1 * | 3/2011 | Ma | 324/762.05 |

FOREIGN PATENT DOCUMENTS

WO    WO 99/34225 A1    7/1999

OTHER PUBLICATIONS

Frank Liu et al., "A Test Structure for Assessing Individual Contact Resistance", IEEE (2009).
Christopher Hess et al., "High Density Test Structure Array for Accurate Detection and Localization of Soft Fails", Conference on Microelectronic Test Structures, vol. 21, Mar. 2008.
M.B. Ketchen and M. Bhushan, "Product-representative "at speed" test structures for CMOS characterization", IBM J. Res. & Dev., vol. 50, No. 4/5, Jul./Sep. 2006.

* cited by examiner

*Primary Examiner* — Arleen M Vazquez
*Assistant Examiner* — Brent J Andrews
(74) *Attorney, Agent, or Firm* — Scully, Scott, Murphy & Presser, P.C.; Daniel P. Morris, Esq.

(57) ABSTRACT

A structure and method is provided for testing a 2-dimensional array of electrical devices, such as a 2-dimensional array in the first metal level (M1) of an electronic structure. The method for testing the 2-dimensional array provides a parallel test approach. The test structure provides a plurality of test pad structures to implement the parallel test approach. The test pad structures may include field effect transistors.

20 Claims, 4 Drawing Sheets

| A0 | A1 | A2 | A3 | A4 | VDD | GND | AVS1 | AVS2 | AVS3 | AVS4 | AVS5 | AVS6 | AVS7 | AVS8 | AVF1 | AVF2 | AVS9 | AVS10 | AVS11 | AVS12 | AVS13 | AVS14 | AVS15 | AVS16 |
|---|---|---|---|---|---|---|---|---|---|---|---|---|---|---|---|---|---|---|---|---|---|---|---|---|

United States Patent US 8,723,528 B2

ACTIVE 2-DIMENSIONAL ARRAY STRUCTURE FOR PARALLEL TESTING

BACKGROUND

The present disclosure relates to electrical testing of microelectronic structures. More specifically, in one embodiment, the present disclosure relates to the electrical testing of structures having a resistance.

In complementary metal oxide semiconductor (CMOS) technology, yield detractors such as opens and shorts in wires and interconnect vias are monitored in the manufacturing line. In early technology development, physical ground rules are explored to maximize the product yield. The guidelines for Design For Manufacturability (DFM) are given to the CMOS product design teams early in the design phase. Resistances of polysilicon (PC), metal gate, contacts, and metal wires are measured and correlated with the physical dimensions obtained from optical metrology tools. With increasing scaling, the contact resistance of contacts, e.g., the metal vias connecting the source, drain and gate terminals of the metal oxide semiconductor field effect transistors (MOSFETs) to the first metal layer (M1), has increased. The increasing resistance may reduce the MOSFET's "on" current, and can result in increased circuit delays. A large number of resistance measurements are required for testing the above mentioned design features, which can increase production cost.

SUMMARY

In one aspect, the present disclosure provides a structure for testing a 2-dimensional array of electrical devices. In one embodiment, the 2-dimensional array of electrical devices includes a first row of device under test (DUT) structures, and at least a second row of DUT structures. The DUT structures in each respective row of the first row or at least second row are connected in series. The structure for testing the 2-dimensional array of electrical devices may include a first row switch that is in electrical communication with the first row of DUT structures, and at least a second row switch that is in electrical communication to at least the second row of DUT structures. Two pads are provided for forcing voltage across any selected row. One voltage pad is for applying a force voltage to the DUT structures in one of the first row and at least the second row. Electrical communication of the voltage pad to the first row of DUT structures is through the first row switch and electrical communication of the voltage pad to at least the second row of DUT structures is through at least the second row switch.

The structure for testing the 2-dimensional array of electrical devices may also include a plurality of test pad structures. Each set of two test pad structures in the plurality of test pad structures is in switchable parallel connection to a DUT structure in the first row of DUT structures and at least the second row of DUT structures. The switchable parallel connection of the set of two test pad structures to the DUT structure is to measure a voltage across the DUT structure.

In another aspect, the present disclosure provides a method for testing a 2-dimensional array of electrical devices that are formed on a substrate. In one embodiment, the 2-dimensional array of electrical devices includes at least a first row of DUT structures and at least a second row of DUT structures. The DUT structures in a respective row are connected in series. The method for testing the 2-dimensional array of electrical devices may include a plurality of test pad structures for electrically contacting each of the DUT structures in the first row and the second row of DUT structures. The plurality of test pad structures provide for a switchable parallel measurement of each of the DUT structures in the first row or at least the second row of DUT structures. The number of test pad structures is equal to a number of DUT structures in the respective row being tested plus an additional test pad structure.

A force voltage is applied across one of the first row and at least the second row of the DUT structures, and a current is measured through one of the first row or at least the second row of the DUT structures that the force voltage is being applied to. A test voltage is simultaneously measured for each of the DUT structures in the first row or the at least the second row of the DUT structures across which the force voltage is applied. The test voltage is measured from the sense pads of the two of the plurality of test pad structures that are in electrical communication to each DUT structure in each of the first row and the at least the second row across which the force voltage is being applied.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which:

FIG. 1b is a circuit schematic of one embodiment of a switch that is depicted in FIG. 1a.

FIG. 2b is a circuit schematic of one embodiment of a DUT structure and a test switch that is depicted in FIG. 2a.

DETAIL DESCRIPTION

Detailed embodiments of the present disclosure are provided herein; however, it is to be understood that the disclosed embodiments are merely illustrative of the structures and methods that may be embodied in various forms. In addition, each of the examples given in connection with the various embodiments of the present disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one embodiment, the present disclosure provides a structure and method for testing a 2-dimensional array of electrical devices, such as a 2-dimensional array in the first metal level (M1) of an electronic structure, e.g., MOSFET or CMOS structure. Test time adds to the cost of MOSFET and CMOS technology development and manufacturing. To reduce test time, the present disclosure provides a parallel test approach, and a test structure to implement the parallel test approach, which minimizes test time. The methods and structures disclosed herein, may include a test structure that provides for resistance measurements from a 2-dimensional (2-D) array implemented with switches, such as semiconductor device switches, e.g., MOSFETS, in the first metal layer (M1) of an electrical device. The first metal level (M1) may be the first layer of metal in a CMOS or MOSFET process. For example, the metal layer above the polysilicon gate layer, i.e., polysilicon gate conductors, is typically referred to as the first metal level (M1).

The physical layout of the 2-dimensional array is configured such that it requires only a single metal layer for wiring with silicon diffusion or polysilicon underpasses. This physical configuration allows implementation of the test structure at the first metal level for early learning in the technology and manufacturing process cycle. Accurate resistance measurements can be made with 4-terminal measurements on all the resistors in parallel.

The design is compact with the 2-dimensional array of resistors placed between the contact I/O pads. It has a form factor suitable for placement on the scribe line. The test structure provides both test time and area efficiency. Area efficiency is further improved with the use of a decoder.

Figure 1A:
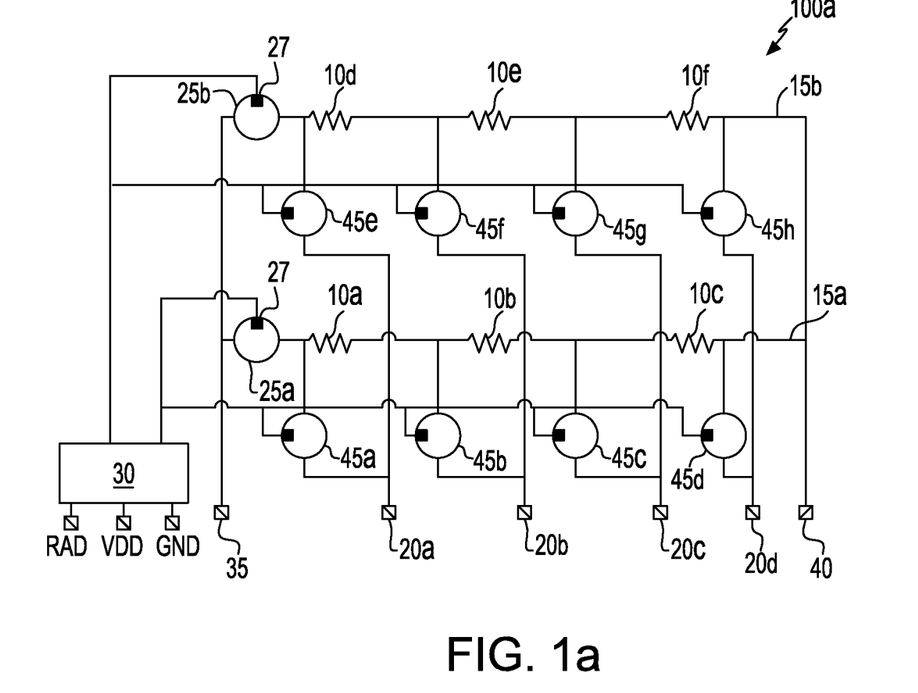
FIG. 1a is a circuit schematic illustrating a structure for testing a 2-dimensional array of electrical devices, in accordance with one embodiment of the present disclosure.
Figure 1B:
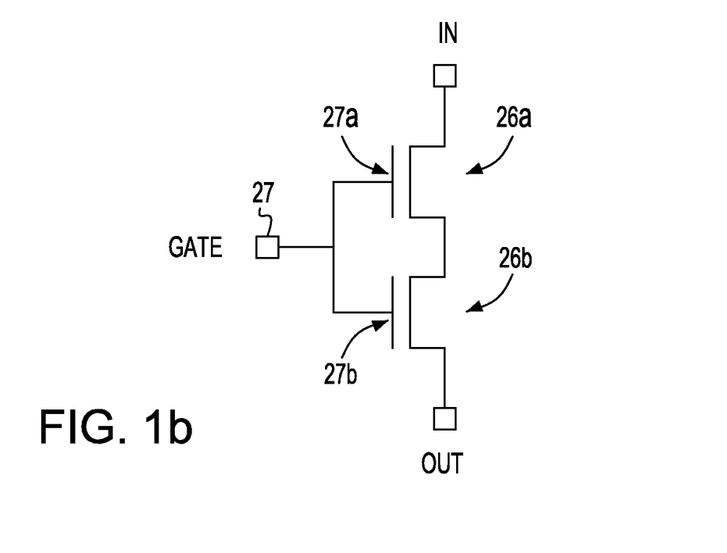
Figure 1C:
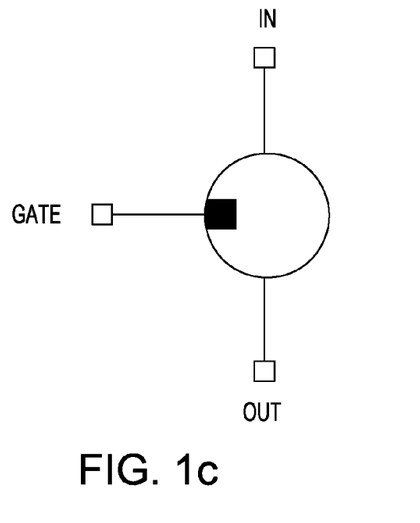
FIG. 1c depicts the symbol of the switch depicted in FIG. 1a, which corresponds to the circuit schematic of the switch depicted in FIG. 1b.

FIGS. 1a-1c depict one embodiment of a test structure 100a for testing a 2-dimensional array of electrical devices. The electrical devices of the 2-dimensional array may be referred to as device under test (DUT) structures. By "2-dimensional array" it is meant that the there are more than two device under test (DUT) structures that are configured on the same plane as a grid of devices in two dimensions, e.g., length and width dimensions. For example, by same plane it is meant a processes level, such as a first-level metal (M1).

The test structure 100a depicted in FIGS. 1a-1c may optimize the time period for measuring the resistance of each of the DUT structures 10a, 10b, 10c, 10d, 10e, 10f in the 2-dimensional array, and the test structure 100a may optimize the substrate area usage, e.g., silicon substrate usage, while still providing 4-terminal measurements of resistances for each of the DUT structures 10a, 10b, 10c, 10d, 10e, 10f. By "4-terminal measurements" it is meant that a device including four probes contacts four sensor pads to make electrical measurements from the four sensor pads. It is noted that 4-terminal type measurements are only one example that is within the scope of the present disclosure, as any number of terminals greater than two may be employed to measure an electrical property across a DUT structure.

In one embodiment, only the first metal level (M1) is required to implement the test structure 100a, but the test structures and methods disclosed herein may be implemented in any number of metal layers. Further, in addition to being implemented with only the first metal level M1, the test structure 100a may be compact as to allow for placement in the scribe line. The "scribe line" is the portion of the substrate that is cut during sectioning of the wafer prior to packaging.

Using the test structure 100a depicted in FIGS. 1a-1c, many 4-terminal electrical measurements, e.g., voltage measurements, can be made in parallel for each of the DUT structures 10a, 10b, 10c, 10d, 10e, 10f in each row 15a, 15b. This provides that each of the DUT structures 10a, 10b, 10c in the first row 15a can be measured simultaneously, and then each of the DUT structures 10d, 10e, 10f in the second row 15b can be measured simultaneously, which can dramatically reduce test time when compared to single resistance measurements for each of the DUT structures 10a, 10b, 10c, 10d, 10e, 10f.

FIG. 1a depicts one embodiment of a test structure 100a that provides for a parallel measurement of the voltage across each DUT structure 10a, 10b, 10c, 10d, 10e, 10f that are present in a plurality of rows 15a, 15b, in which in each of the DUT structures 10a, 10b, 10c, 10d, 10e, 10f in each row 15a, 15b are connected in series. The test structure 100a depicted in FIG. 1a includes two rows 15a, 15b of DUT structure, and in one embodiment each row 15a, 15b includes three DUT structures 10a, 10b, 10c, 10d, 10e, 10f, in which the 2-dimensional array may be referred to as a 3×2 matrix. Although FIG. 1a only depicts two rows 15a, 15b, of DUT structures 10a, 10b, 10c, 10d, 10e, 10f in which each row includes only three DUT structures 10a, 10b, 10c, 10d, 10e, 10f, it is noted that the methods and structures disclosed herein are applicable to any number of rows 15a, 15b of DUT structures 10a, 10b, 10c, 10d, 10e, 10f, and any number of DUT structures 10a, 10b, 10c, 10d, 10e, 10f may be present connected in series in each row 15a, 15b. By "connected in series" it is meant that a plurality of electrical structures, such as DUT structures, are connected along a single path so that the same current flows through all the electrical structures. For example, when the DUT structures 10a, 10b, 10c are connected in series in the first row 15a, the DUT structures 10a, 10b, 10c are connected along a single path, so the same current flows through all of the DUT structures 10a, 10b, 10c in the first row 15a. For example, when the DUT structures 10d, 10e, 10f are connected in series in the second row 15b, the DUT structures 10e, 10f, 10g are connected along a single path, so the same current flows through all of the DUT structures 10e, 10f, 10g in the second row 15b. In one embodiment, the number and positioning of the DUT structures 10a, 10b, 10c in the first row 15a of the DUT structures mirrors a number and positioning of the DUT structures 10e, 10f, 10g in the second row 15b of the DUT structures. In one example, the test structure 100a can accommodate up to 480 DUT structures with a linear array of 25 pads (1×25 padset).

Although, the DUT structure 10a, 10b, 10c, 10d, 10e, 10f is illustrated as a resistor in the circuit diagrams depicted in FIGS. 1a-1c, the DUT structures 10a, 10b, 10c, 10d, 10e, 10f are not limited to this embodiment. Examples of DUT structures for other embodiments of the test structure 100a include, but are not limited to, resistors, contacts, via structures, doped semiconductor regions (also referred to as diffusion regions), wiring, and combinations thereof. When the DUT structure 10a, 10b, 10c, 10d, 10e, 10f is a via structure, the via structure may be a metal via or a via composed of doped polysilicon, e.g., n-type or p-type doped polysilicon. Examples of doped semiconductor regions that may provide the DUT structure 10a, 10b, 10c, 10d, 10e, 10f include well regions within a semiconductor substrate, such as portions of the semiconductor substrate doped with n-type or p-type dopants. The DUT structures 10a, 10b, 10c, 10d, 10e, 10f may also include polysilicon segments, silicided polysilicon segments, silicon diffusion segments, silicided silicon diffusions segments, metal wire segments, metal gate segments and combinations thereof. It is noted that the above description of the DUT structures 10a, 10b, 10c, 10d, 10e, 10f is provided for illustrative purposes only, and is not intended to limit the present disclosure, as the test structure and methods disclosed herein are well suited for measuring all silicon-to-metal via resistances and linewidth variations, as used in all design for manufacturability (DFM) applications to improve yield.

In one embodiment, by "parallel measurement" or "parallel connection" it is meant that two consecutive sense pads may be configured for electrical connection and measurement across a DUT structure in a first row via a respective set of first switches, e.g., first row switch and first test switch, or for connective and measurement across a DUT structure in a second row via a respective set of second switches, e.g., second row switch and second test switch. For example, for every set of two sense pads 20a, 20b, 20c, 20d of the test structure 100a there is one DUT 10a, 10b, 10c, 10d, 10e, 10f in electrical communication with the set of sense pads 20a, 20b, 20c, 20d in each row 15a, 15b of the plurality of rows of DUT structures 10a, 10b, 10c, 10d, 10e, 10f. For example, the first and second sense pads 20a, 20b, are connected in parallel to the first DUT 10a in the first row 15a and the first DUT 10b in the at least the second row 15b through a plurality of switches. In this manner, a measurement of voltage across the first DUT 10a in the first row 15a, can be from the first and second sense pads 20a, 20b, and then via a switch from the first row 15a to the second row 15b, a measurement of voltage across the first DUT structure 10d in the second row 15b can be taken from the same first and second sense pads 20a, 20b. This is one example of a parallel measurement or parallel connection. Further, because the measurement can be taken from the same sense pads for a DUT structure in each of the rows of DUT structures, the parallel measurement or connection may be "switchable".

Referring to FIGS. 1a-1c, the test structure 100a includes a first row switch 25a in electrical communication with one end of the first DUT structure 10a of the first row 15a of DUT structures 10a, 10b, 10c, and at least a second row switch 25b in electrical communication with one end of the first DUT structure 10d of the at least the second row 15b of DUT structures 10e, 10f, 10g. By "electrical communication" it is meant that the an electrical signal, such as a current, may pass from the first and second row switch 25a, 25b, to the respective first and second row 15a, 15b. Electrical communication between elements may be provided by switches and conductive lines, e.g., wiring. The "switch" may be any structure that allows for the electrical signal to be turned on or off. In one embodiment, the number of row switches, e.g., first row switch 25a and second row switch 25b, is equal to the number of rows 15a, 15b. Although FIG. 1a only discloses two rows 15a, 15b of DUT structures 10a, 10b, 10c, 10d, 10e, 10f, and therefore two row switches 25a, 25b, the present disclosure is applicable to any numbers or any number of row switches. In one embodiment, the 2-dimensional array may include up to 70 rows of DUT structures, and may include 70 row switches, wherein each row switch corresponds to each row of DUT structures. In another example, the 2-dimensional array may include up to 40 rows of DUT structures, and may include 40 row switches, wherein each row switch corresponds to each row of DUT structures.

Examples of switches that are suitable for the first and second row switch 25a, 25b include a microelectronic device selected from the group consisting of field effect transistors (FETs), bipolar transistors, Schottky barrier devices, and combinations thereof. A FET, such as a MOSFET, is a transistor in which output current, i.e., source-drain current, is controlled by the voltage applied to the gate. A FET has three terminals, i.e., gate, source and drain. Examples of FETs that are suitable for the first and second row switch 25a, 25b include MOSFETs, CMOS devices, junction field effect transistor (JFET) and combinations thereof.

FIG. 1b depicts the circuit diagram of one embodiment of a first row switch 25a or second switch 25b for use in the test structure 100a that is depicted in FIG. 1a. In one embodiment, each of the first and second switch 25a, 25b include two field effect transistors 26a, 26b, e.g., n-type field effect transistors (nFETS), that are connected in series. The configuration of the first and second switch 25a, 25b provided by two n-type field effect transistors (nFETS) that are connected in series may reduce off-switch channel leakage by greater than 10× when compared to the channel leakage of a single nFET. Each of the field effect transistors 26a, 26b that provide the switch include a gate structure 27a, 27b, wherein the combinations of gate structures 27a, 27b of the field effect transistors 26a, 26b provide the gate structure 27 of the first switch and at least the second switch 25a, 25b.

FIG. 1c depicts the symbol used to describe the first and at least the second switch 25a, 25b in FIG. 1a that corresponds to the circuit schematic of the switch depicted in FIG. 1b. As illustrated in FIG. 1c, in one embodiment, for each of the first and at least the second row switch 25a, 25b, the gate 27 of each of the first row switch 25a and at least the second row switch 25b is in electrical communication with a decoder device 30, and one of the source region or drain region is in direct electrical communication with at least one voltage pad 35, 40 for applying a force voltage. By "direct" electrical communication it is meant that a switch is not present between the voltage pads 35, 40 and one of the source or drain terminal of the first row switch 25a and at least the second row switch 25b. The other of the source and drain region of the first row switch 25a and at least the second row switch 25b that is not in direct electrical communication with the voltage pad 35, 40 is in series connection with one of the DUT structures 10a, 10d, of the respective row that the first row switch 25a and at least the second row switch 25b are in electrical communication with. That is electrical communication of the voltage pad 35, 40 to the first row 15a is through the first row switch 25a, and electrical communication of the voltage pad 35, 40 to the at least the second row 15b is through the at least the second row switch 25b.

Referring back to FIG. 1a, the test structure 100a further includes a plurality of test pad structures. Two of the plurality of test pad structures in the plurality of test pad structures are electrical communication to each DUT structure 10a, 10b, 10c, 10d, 10e, 10f, 10g, in each of the first row 15a and the at least the second row 15b. More specifically, in one embodiment, the number of test pad structures is equal to the number of DUT structures 10a, 10b, 10c, 10e, 10f, 10g, in a row 15a, 15b plus an additional test pad structure to ensure voltage measurements across any single DUT structure 10a, 10b, 10c, 10e, 10f, 10g, in a row 15a, 15b can be performed. Using the example depicted in FIG. 1a, for a total of three DUT structures 10a, 10b, 10a in the first row 15a, and three DUT structures 10d, 10e, 10f in the second row 15b, the number of test pad structures would be equal to four, which provides an additional test pad structure for the number of DUT structures 10a, 10b, 10c, 10d, 10e, 10f, in each row 15a, 15b.

Each test pad structure includes a sense pad 20a, 20b, 20c, 20d, a first test switch 45a, 45b, 45c, 45d and at least a second test switch 45e, 45f, 45g, 45h. The first and second test switches 45a, 45b, 45c, 45d, 45e, 45f, 45g, 45h may be any structure that allows for the electrical signal to be turned on or off. Similar to the above described first and second row switch 25a, 25b, the first and second test switches 45a, 45b, 45c, 45d, 45e, 45f, 45g, 45h may each be a microelectronic device that is selected from the group consisting of FETs, bipolar transistors, Schottky barrier devices, and combinations thereof. Examples of field effect transistor that are suitable for the first and second test switches 45a, 45b, 45c, 45d, 45e, 45f, 45g, 45h include MOSFETs, CMOS devices, JFET transistor and combinations thereof. Similar to the first and second row switch 25a, 25b, the circuit diagram for the first and second test switches 45a, 45b, 45c, 45d, 45e, 45f, 45g, and 45h is depicted in FIG. 1b.

Referring to FIG. 1b, in one embodiment, the first and at least the second test switch 45a, 45b, 45c, 45d, 45e, 45f, 45g, 45h, include two field effect transistors 26a, 26b, e.g., n-type field effect transistors (nFETS), that are connected in series. Each of the field effect transistors 26a, 26b that provide the switch include a gate structure 27a, 27b, wherein the combinations of gate structures 27a, 27b of the field effect transistors 26a, 26b provide the gate structure 27 of the first test switch 45a, 45b, 45c, 45d, and at least the second test switch 45e, 45f, 45g, 45h. Similar to the first row switch 25a and the second row switch 25b, FIG. 1c depicts the symbol used to describe the first test switch 45a, 45b, 45c, 45d, and the second test switch 45e, 45f, 45g, 45h in FIG. 1a that corresponds to the circuit schematic of the switch depicted in FIG. 1b. As illustrated in FIG. 1a, the gate structure 27 of each of the first test switch 45a, 45b, 45c, 45d, and at least the second test switch 45; 45f, 45g, 45h is in direct electrical communication with the decoder 30. One of the source and drain regions of each of the first test switch 45a, 45b, 45c, 45d, and at least the second test switch 45e, 45f, 45g, 45h is in direct electrical communication with the sense pad 20a, 20b, 20c, 20d, and the other of the source and drain region of each of the first test switch and at least the second test switch 45a, 45b, 45c, 45d, 45e, 45f, 45g, 45h is in direct electrical communication with a DUT structure 10a, 10b, 10c, 10d, 10e, 10f.

The sense pads 20a, 20b, 20c, 20d may be composed of an electrically conductive materials, such as a metal, e.g., aluminum or copper. The dimensions and geometry of the sense pads 20a, 20b, 20c, 20d, is selected to allow it to be contacted by a probe for electrical measurements. The sense pads 20a, 20b, 20c, 20d may be positioned in an in-line geometry. For example, each of the sense pads 20a, 20b, 20c, 20d, may have 40 micron by 40 micron geometry. In another example, each of the sense pads 20a, 20b, 20c, 20d, may have a rectangular geometry with a length dimension of 60 microns and a width dimension of 60 microns. In yet another example, the sense pads 20a, 20b, 20c, 20d may be configured to take advantage of a 1×25 pad set with a 60 micron by 90 micron test probe landing pads.

The number of test pad structures is selected so that two sense pads, two first test switches, and at least two second switches correspond to each DUT structure in the first row and the second row. In one embodiment, a single test pad structure is adapted for electrical connection at locations between successive DUT structures 10a, 10b, 10c, 10e, 10f, 10g, and also at the beginning and end of the row of successive DUT structures 10a, 10b, 10c, 10d, 10e, 10f, in each respective first and second row 15a, 15b through a respective first test switch 45a, 45b, 45c, 45d, and a second test switch 45e, 45f, 45g, 45h, thereby establishing a switchable parallel connection between any two tests pad structures and a DUT structure 10a, 10b, 10c, 10e, 10f, 10g of a respective row 15a, 15b. For example, a first sense pad 20a is in electrical communication through a first test switch 45a to a first side of the first DUT structure 10a in the first row 15a, and is in electrical communication to a first side of a first DUT structure 10d in a second row 15b through a second test switch 45e. A second sense pad 20b is in electrical communication through an adjacent first test switch 45b to a second side (opposite the first side) of the first DUT structure 10d in a first row 15a, and is electrical communication to a second side of a first DUT structure 10d in a second row 15b through a second test switch 45f Two test switches 45a, 45b are activated to switch conductive sense pads (e.g., 10a, 20b) across a DUT structure (e.g. 10a, 10d) of a selected row.

Although, FIG. 1a only depicts two rows 15a, 15b of DUT structures, 10a, 10b, 10c, 10d, 10e, 10f, and therefore only two test switches 45a, 45b, it is noted that the present disclosure is applicable to any number of rows of 15a, 15b of DUT structures, and therefore the test pad structures may have any number of test switches 45a, 45b. For example, when the test structure includes three rows of DUT structures, each test pad structure may include three test switches, and when the test structure includes four rows of DUT structures, each test pad structure may include four test switches.

A measurement of an electrical property, e.g., voltage measurement, across one of the first DUT structure 10a in the first row 15a, or the first DUT structure 10d in the second row 15b, may be taken from the first and second sense pads 20a, 20b. A measurement of an electrical property, e.g., voltage measurement, across one of the second DUT structure 10b in the first row 15a, or the second DUT structure 10e in the second row 15b, may be taken from the second and third sense pads 20b, 20c. A measurement of an electrical property, e.g., voltage measurement, across one of the third DUT structure 10c in the first row 15a, or the third DUT structure 10f in the second row 15b, may be taken from the third and fourth sense pads 20c, 20d.

In one example, to take a measurement from the first sense pad 20a and the second sense pad 20b for the first DUT structure 10a in the first row 15a, a voltage (also referred to as "force voltage") is applied through the first row 15a via pad 35, as shown in FIG. 1a. More specifically, to apply the force voltage to the first row 15a, the first row switch 25a is turned "on", and the second row switch 25b is turned "off", and a voltage (force voltage) applied from the voltage pad 35 is forced through the first row 15a. To select the first row 15a from which the electrical measurement is taken for the first DUT structure 10a from the first and second sense pads 20a, 20b, the first test switches 45a, 45b are turned "on" and the second test switches 45e, 45f are turned "off".

In another example, to take a measurement from the first sense pad 20a and the second sense pad 20b for the first DUT structure 10d in the second row 15b, a voltage (also referred to as "force voltage") is applied through the first row 15b via the voltage pad 35, as shown in FIG. 1a. To apply the force voltage to the second row 15b, the second row switch 25b is turned "on", and the first row switch 25a is turned "off", and a voltage (force voltage) applied from the voltage pad 35 is forced through the second row 15b. To select the second row 15b from which the electrical measurement is taken for the first DUT structure 10d from the first and second sense pads 20a, 20b, the first test switches 45a, 45b are turned "off" and the second test switches 45e, 45f are turned "on".

In one embodiment, regardless of the number or rows and test switches, a single sense pad structure 20a, 20b, 20c, 20d is adapted for electrical connection at locations between successive DUT structures 10a, 10b, 10c, 10d, 10e, 10f of said each respective first row 15a and at least a second row 15b through a respective first test switch 45a, 45b, 45c, 45d and a second test switch, 45e, 45f, 45g, 45h thereby establishing switchable parallel connection between any two single test pad structures and a DUT of a respective row. In one embodiment, the first tests switches 45a, 45b, 45c, 45d and second test switches 45e, 45f, 45g, 45h allow for each of the DUT structures 10a, 10b, 10c in the first row 15a to be measured simultaneously, or each of the DUT structures 10d, 10e, 10f in the second row 15b to be measured simultaneously.

Low resistance wires are used for connections between the DUT structures 10a, 10b, 10c, 10d, 10e, 10f, in order to keep the wire resistance smaller than the resistance of the DUT structures 10a, 10b, 10c, 10, 10e, 10f. For example, when the DUT structures 10a, 10b, 10c, 10d, 10e, 10f have a resistance ranging from $2\Omega$ to $10000\Omega$, the wiring may have a resistance ranging from $0.1\Omega$ to $100\Omega$. In another example, when the DUT structures 10a, 10b, 10c, 10d, 10e, 10f have a resistance ranging from $5\Omega$ to $100\Omega$, the wiring may have a resistance ranging from $0.1\Omega$ to $5\Omega$.

Referring to FIG. 1(a), in one embodiment, the activation signal to the first and second tests switches 45a, 45b, 45c, 45d, 45e, 45f, 45g, 45h, and the first and second row switches 25a, 25b is provided by a decoder 30. In one embodiment, the decoder 30 is in electrical communication with the gate structure 27 of at least one of the first and second row switches 25a, 25b, and is in electrical communication with the gate structure 27 of the first and second test switches 45a, 45b, 45c, 45d, 45e, 45f, 45g, 45h.

The activation signal sent by the decoder 30 to the gate structure 27 of the first and second row switch 25a, 25b, and the first and second tests switches 45a, 45b, 45c, 45d, 45e, 45f, 45g, 45h may be an electrical current that switches the first and second test switches 45a, 45b, 45c, 45d, 45e, 45f, 45g, 45h, and the first and second row switch 25a, 25b from an "off" to "on" state, and vice versa. An output bit from the decoder 30 may operate all of the switches in a row 15a, 15b. For example, the decoder 30 is used to select a row 15a, 15b, and the same decoder 30 output bit makes or breaks the connection of the terminals to the DUT structures 10a, 10b, 10c, 10d, 10e, 10f in the selected row 15a, 15b to the sense pads 20a, 20b, 20c, 20d.

More specifically, in one example, the output bit from the decoder 30 to the first row switch 25a, and the first test switches 45a, 45b, 45c, 45d is high or equal to a logic "1" voltage, and the output bit from the decoder 30 to the second row switch 25b, and the second test switches 45e, 45f, 45g, 45h is low or equal to a logic "0" voltage level. As an example, low voltage is at ground (GND) potential and high voltage is the power supply voltage at 1.0 V to 5 V. For example, for the embodiment depicted, when the output bit from the decoder 30 to the first row switch 25a is high or equal to a logic "1" voltage level, the first test switch 25a is turned "on" to connect the one end of the first row 15a to the voltage pad 35, and when the output bit from the decoder 30 to the first test switches 45a, 45b, 45c, 45d is high or equal to a logic "1" voltage level, the first test switches 45a, 45b, 45c, 45d are turned "on" to connect the sense pads 20a, 20b, 20c, 20c to the respective DUT structures 10a, 10b, 10c in the first row 15a. To disconnect the second row 15b from the voltage pad 35, the output bit from the decoder 30 to the second row switch 25b is set low or equal to a logic "0" voltage level. When the output bit from the decoder 30 to the second test switches 45e, 45f, 45g, 45h, is set low or to a logic "0" voltage level, the second test switches 45e, 45f, 45g, 45h are "off" to disconnect the DUT structures 10d, 10e, 10f in the second row 15b from the sense pads 20a, 20b, 20c, 20d. The voltage across each of the DUT structures 10a, 10b, 10c, in the first row 15a may be read from the sense pads 20a, 20b, 20c, 20c using a four terminal measurement. The voltage on all the sense pads may be read in parallel and simultaneously for time test reduction. In this manner, four terminal measurements, e.g., voltage measurements, can be made simultaneously for each DUT structure 10a, 10b, 10c in the first row 15a.

Still referring to FIG. 1a, in another example, the output bit from the decoder 30 to the first row switch 25a, and the first test switches 45a, 45b, 45c, 45d is set low or equal to a logic "0" voltage level, and the output bit from the decoder 30 to the second row switch 25b, and the second test switches 45e, 45f, 45g, 45h is set high or equal to a logic "1" voltage level. When the output bit from the decoder 30 to the second row switch 25b is set high or equal to a logic "1" voltage level, the second row switch 25b is turned "on" to connect the one end of the second row 15b to the voltage pad 35, and when the output bit from the decoder 30 to the second test switches 45e, 45f, 45g, 45h is set high or equal to a logic "1" voltage level, the second test switches 45e, 45g, 45g, 45h are turned "on" to connect the sense pads 20a, 20b, 20c, 20c to the respective DUT structures 10d, 10e, 10f in the second row 15b. To disconnect the first row 15a from the voltage pad 35, the output bit from the decoder 30 to the first row switch 25a is set low or equal to a logic "0" voltage level. When the output bit from the decoder 30 to the first test switches 45a, 45b, 45c, 45d, is set low or to a logic "0" voltage level, the first test switches 45a, 45b, 45c, 45d are "off" to disconnect the DUT structures 10a, 10b, 10c in the first row 15a from the sense pads 20a, 20b, 20c, 20d. The voltage across each of the DUT structures 10d, 10e, 10f, in the second row 15b may be read from the sense pads 20a, 20b, 20c, 20d, using a four terminal measurement. The voltage on all the sense pads 20a, 20b, 20c, 20d, may be read in parallel and simultaneously for time test reduction. In this manner, four terminal measurements, e.g., voltage measurements, can be made simultaneously for each DUT structure 10d, 10e, 10f in the second row 15b.

In the embodiment shown, the decoder 30 may be a 3-bit decoder or a 5-bit decoder. In one embodiment, a 3-bit bit decoder includes a 3-bit input pattern that selects 1 of 8 outputs. In the case of a 5-bit decoder, the 5-bit input pattern selects 1 of 32 outputs. In a 1×25 padset, with a 5-bit decoder and 32 rows of DUT structures each containing 15 DUT structures, a total of 480 DUT structures can be accommodated in the test structure of the 2-dimensional array of electrical devices.

In another embodiment, instead of the decoder to activate the first test switches 45a, 45b, 45c, 45d, the second test switches 45e, 45g, 45g, 45h, and the first and second row switches 25a, 25b, activation of the first test switches 45a, 45b, 45c, 45d, the second test switches 45e, 45g, 45g, 45h, and the first and second row switches 25a, 25b may be provided by applying an activation signal to dedicated pads (not shown) that are in electrical communication to the gate structures of the first test switches 45a, 45b, 45c, 45d, the second test switches 45e, 45g, 45g, 45h, and the first and second row switches 25a, 25b.

When the area of the DUT structures 10a, 10b, 10c, 10d, 10e, 10f are large, the rows 15a, 15b are placed above the sense pads 20a, 20b, 20c, 20d, and wired as shown in FIG. 1a. DUT structures 10a, 10b, 10c, 10d, 10e, 10f having an area ranging from 10 microns$^2$ to 1000 microns$^2$ are considered to have a large area, and are suitable for the wiring layout that is depicted in FIG. 1a. Examples of DUT structures 10a, 10b having a large area that would dictate the wiring layout depicted in FIG. 1a include, but are not limited to long wide wire segments, long wide segments of gate structure (PC), long wide segments of active substrate area (RX) and combinations thereof.

Figure 2A:
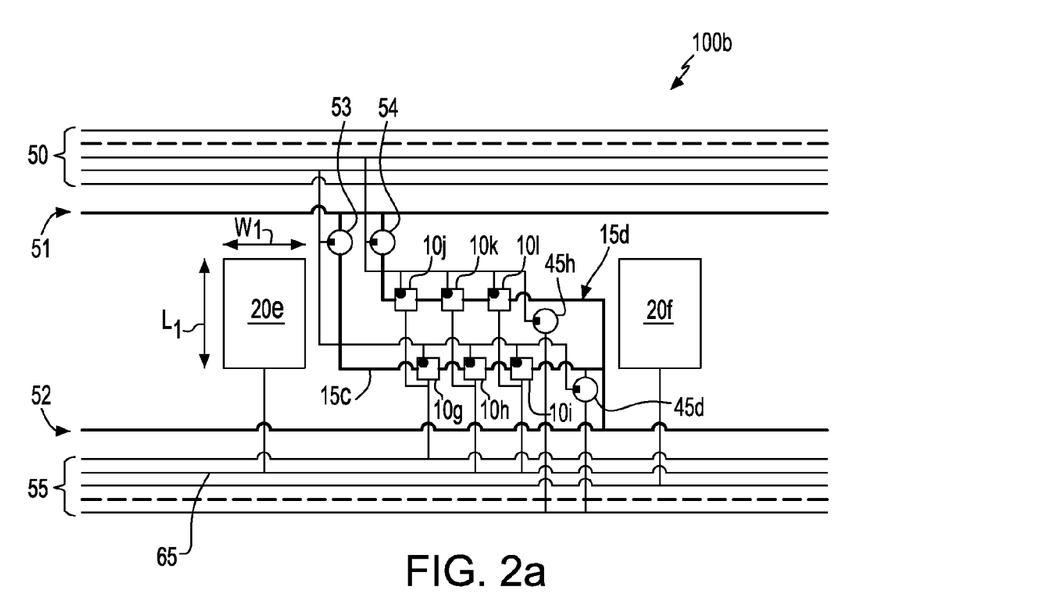
FIG. 2a is a macro wiring schematic illustrating two rows of a 2-dimensional array of electrical devices positioned between two sense pads of test pad structures for a parallel measurement of a DUT structure in a first row of DUT structures or at least a second row of DUT structures in the 2-dimensional array of electrical devices being tested, in accordance with one embodiment of the present disclosure.

For DUT structures having a smaller area, the physical layout of the test structure 100a depicted in FIGS. 1a-1c can be organized in a more space efficient design requiring only a single level of metal (M1), as depicted in FIGS. 2a-2d. DUT structures having a smaller area include DUT structures having an area ranging from 0.01 microns$^2$ to 10 microns$^2$ are suitable for the wiring layout that is depicted in FIG. 2a. Examples of DUT structures having an area that would dictate the wiring layout depicted in FIG. 2a include, but are not limited to metal to silicon contacts (CA), segments of gate structure (PC), segments of active substrate area (RX), thin narrow metal wire segments, EDRAM straps, contacts between different metal layers, and combinations thereof.

FIG. 2a depicts a wiring scheme including three DUT structures 10g, 10h, 10i, 10j, 10k, 10l in two rows 15c, 15d, wherein the DUT structures 10g, 10h, 10i, 10j, 10k, 10l are positioned between two sense pads 20e, 20f. The sense pads 20e, 20f may have a width W1 of 40 microns and a length L1 of 60 microns. In another embodiment, the sense pads 20e, 20f have a width W1 of 40 microns and a length L1 of 40 microns. The space between the two sense pads 20e, 20f depicted in FIG. 2a, in which the DUT structures 10g, 10h, 10i, 10j, 10k, 10l, may have a width ranging from 30 microns to 50 microns. In one embodiment, the space between the two sense pads 20e, 20f that the DUT structures 10g, 10h, 10i, 10j, 10k, 10l are positioned in may have a width ranging from 35 microns to 45 microns, wherein in one example the width is equal to 40 microns. The two rows 15c, 15d are connected to a voltage pad (not shown) by a first row switch 53 and a second row switch 54. The first row switch 53 and the second row switch 54 depicted in FIG. 2a are similar in structure and function to the first row switch 25a and the second row switch 25b that are described above with reference to FIGS. 1a and 1b. Therefore, the above description of the first and second row switch 25a, 25b that are depicted in FIGS. 1a and 1b, is suitable for at least one embodiment of the first and second row switches 53, 54 that are depicted in FIG. 2a.

Figure 2B:
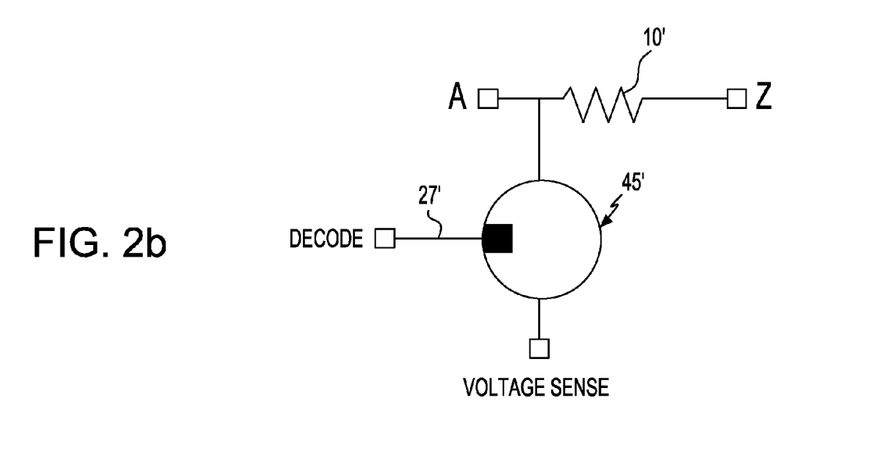
Figure 2C:
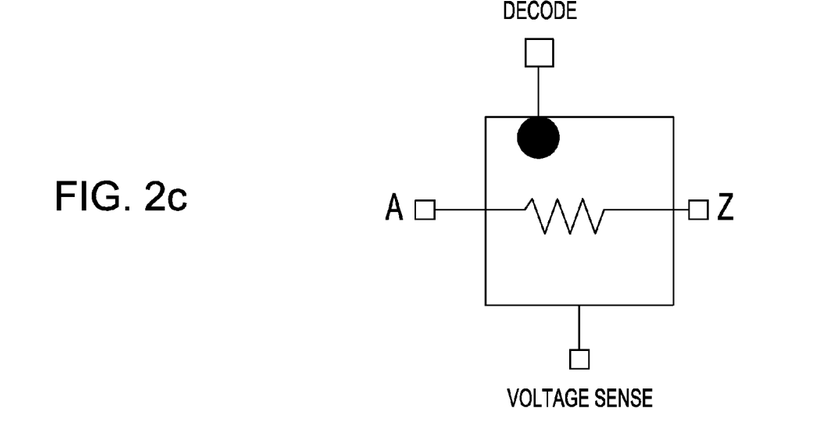
FIG. 2c depicts the symbol of the DUT structure and the test switch that is depicted in FIG. 2a, which corresponds to the circuit schematic of the DUT structure and the test switch depicted in FIG. 2b.

FIG. 2b is a circuit schematic of a DUT structure 10' (such as the DUT structure 10g, 10h, 10i, 10j, 10k, 10l that is depicted in FIG. 2a) and a test switch 45' that is in electrical communication with one end, i.e., terminal, of the DUT structure 10'. In one embodiment, the test switch 45' that is depicted in FIG. 2b is similar in configuration to the test switch that is depicted in FIG. 1b. More specifically, in one embodiment, the test switch 45' that is depicted in FIG. 2b may include two field effect transistors 26a, 26b, e.g., n-type field effect transistors (nFETs), that are connected in series, as described above with reference to FIG. 1b. As described above, each of the field effect transistors 26a, 26b depicted in FIG. 1b that provide the test switch include a gate structure 27a, 27b, wherein the combinations of gate structures 27a, 27b of the field effect transistors 26a, 26b provide the gate structure 27' of the test switch 45' that is depicted in FIG. 2b. The test switch 45' is connected to the terminal of the DUT structure 10' through one of the source or drain region of the test switch 45'. FIG. 2c depicts the symbol of the DUT structure 10' and a test switch 45' as depicted in FIG. 2a, in which the symbol depicted in FIG. 2c corresponds to the circuit diagram of FIG. 2b.

Each of the test switches, when activated, provides electrical communication between one terminal of a DUT structure and a sense pad for taking an electrical measurement of the DUT structure. For example, referring to FIG. 2a, the sense pad 20e on one side of the DUT structures 10g, 10h, 10i, 10j, 10k, 10l, is in electrical communication to a DUT structure 10h in the first row 15c of DUT structures through a first test switch, and is in electrical communication to a DUT structure 10k in the second row 15d of DUT structures through a second test switch. In one embodiment, the output bit wires 50, the voltage force wires 51, 52, and the voltage sense wires 55 travel parallel to each other on the first metal level M1 and are offset from the sense pads 20e, 20f, as depicted in FIG. 2a. The output bit wires 50 connect the decoder 30 to the test switches to the DUT structures 10g, 10h, 10i, 10j, 10k, 10l. The force voltage wires 51, 52 connect the voltage pad (not show) to supply force voltage to the first and second row switch 53, 54. The voltage sense wires 55 connect the terminals of the DUT structures, e.g., DUT structures 10h, 10k, through the test switches to the sense pads, e.g., sense pad 20e.

Figure 2D:
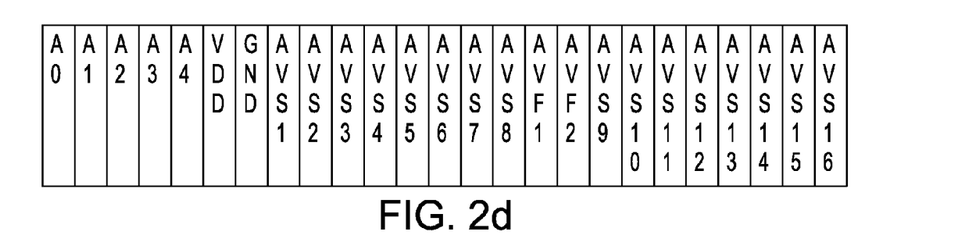
FIG. 2d is a chart depicting one embodiment of the input/output (I/O) pad assignments, i.e., sense pad assignments, of a structure for testing a 2-dimensional array of electrical devices at the first metal level (M1) of an electrical device, in accordance with the present disclosure.

In one embodiment, the test structure and method of the present disclosure may employ a 1×25 pad set, with a five-bit decoder and 32 rows of DUT structures, wherein each row contains 15 DUT structures, to provide a total of 480 DUT structures in an 2-dimensional. Although, the wiring scheme illustrated in FIG. 2a only includes three DUT structures 10g, 10h, 10i in a first row 15c, and three DUT structures 10j, 10k, 10l in a second row 15d, FIG. 2d depicts the I/O pad assignments, i.e., sense pad assignments, of a 2-dimensional array of 480 DUT structures is provided in 32 rows of 15 DUT structures. Referring to FIG. 2d, sense pads having assignments A0, A1, A2, A3, A4 are inputs to a 5 bit decoder to select one of the 32 rows of DUT structures. In the embodiment in which there are 32 rows of DUT structures, 32 row switches would be present in the test structure. AVF1 and AVF2 are configurations of sense pad assignments for the voltage force pads, i.e., voltage pads, that are similar to the voltage pad 35 described above with reference to FIG. 1c.

Still referring to FIG. 2d, one sense pad assignment is for ground GND, and another sense pad assignment is for the decoder VDD. The remaining 16 sense pad assignments identified by AVS01, AVS02, AVS03, AVS04, AVS05, AVS06, AVS07, AVS08, AVS09, AVS10, AVS11, AVS12, AVS13, AVS14, AVS15, and AVS16 are sense pad assignments for measuring the voltage across each of the 15 DUT structures that are present in a single row. In an example embodiment, in which there are 32 rows of 15 DUT structures, 516 test switches would be present in the test structure. The test structure and method of the present disclosures may also employ a 1×50 pad set macro.

In another aspect of the present disclosure, a method for testing a 2-dimensional array of electrical devices is provided that utilizes a parallel test approach, which minimizes test time. By parallel test it is meant that all DUT in a row are tested in parallel. More specifically, the voltage at each sense pad 20a, 20b, 20c, 20d is measured, and the voltage across a DUT structure 10g, 10h, 10i, 10j, 10k, 10l is equal to the voltage difference between two of the sense pads 20a, 20b, 20c, 20d.

The method is described with reference to structure depicted in FIGS. 1a-1c, and the flow chart depicted in FIG. 3. Although the method is described with the test structure 100a that is described above with reference to FIGS. 1a-1c, the method disclosed herein is applicable to any test structure within the scope of the present disclosure including the test structure 100b that is depicted in FIGS. 2a-2c. The method sequence depicted in FIG. 3 does not limit the present disclosure to that sequence of steps, as additional initial, intermediate and concluding steps may be included, which are not depicted in FIG. 3. Further, although the example that is provided in FIG. 3 includes a decoder 30 to select the row 15a, 15b of DUT structures, as well as select/activate the test switches 45a, 45b, 45c, 45d, 45e, 45f, 45g, the decoder 30 is optional, and may be replaced by dedicated pads to each of the row switches 25a, 25b and the test switches 45a, 45b, 45c, 45d, 45e, 45f, 45g.

The 2-dimensional array of electrical devices being tested by the present method depicted in FIGS. 1a-1c include at least a first row 15a of device under test (DUT) structures 10a, 10b, 10c and at least a second row 15b of DUT structures 10e, 10f, 10g. The DUT structures 10a, 10b, 10c, 10d, 10e, 10f in each respective row 15a, 15b are connected in series. As indicated above with reference to FIGS. 1a-1c, the 2-dimensional array may include any number of DUT structures, and any number of rows containing the DUT structures. The test structure 100 typically also includes a row switch providing electrical communication between each row 15a, 15b and the voltage pad 35. For example, a first row switch 25a provides electrical communication between the first row 15a and the voltage pad 35, and a second row switch 25b provides electrical communication between at least the second row 15b and the voltage pad 35.

Each of the DUT structures 10a, 10b, 10c, 10d, 10e, 10f may then be electrically contacting with a plurality of test pad structures that provide for a switchable parallel measurement of each of the DUT structures 10a, 10b, 10c in the first row 15a or each of the DUT structures 10d, 10e, 10f in the second row 15b. By electrically contacted it is meant that the test pad structures are in electrical communication with the DUT structures 10a, 10b, 10c, 10d, 10e, 10f, in which the electrical communication may be through a plurality of FET switches, e.g., first and second test switches 45a, 45b, 45c, 45d, 45e, 45f, 45g.

In one embodiment, two of the plurality of test pad structures in the plurality of test pad structures are in electrical communication to each DUT structure 10a, 10b, 10c, 10d, 10e, 10f in each of the first row 15a or the second row 15b. Each test pad structure may include a sense pad 20a, 20b, 20c 20d from which a parallel measurement of an electrical property is taken from the DUT structures 10a, 10b, 10c, 10d, 10e, 10f in the first row 15a or the second row 15b. The test pad structures may also include test switches. For example, each of the test pad structures may include a first test switch 45a, 45b, 45c, 45d to each DUT structure 10a, 10b, 10c in the first row 15a, and a second test switch 45e, 45f, 45g, to each DUT structure 10d, 10e, 10f, in the second row 15b.

Figure 3:
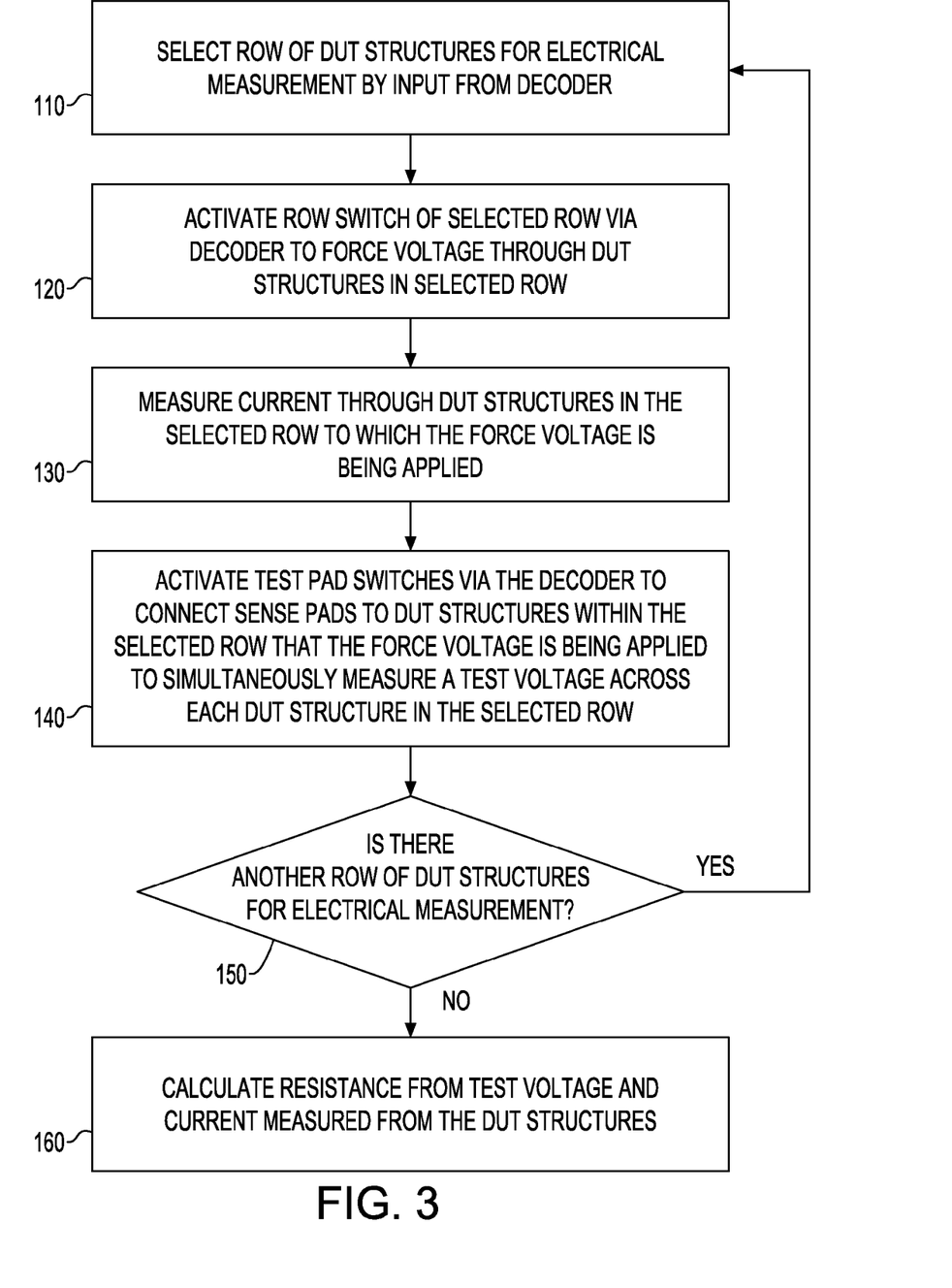
FIG. 3 is a flow chart describing one embodiment of the method of testing a 2-dimensional array of electrical devices, in accordance with the present disclosure.

Referring to FIG. 1a and FIG. 3, in one embodiment, the electrical measurement of the DUT structure 10a, 10b, 10c may begin with a step 110 of selecting a row 15a, 15b for electrical measurement by input from the decoder 30. A force voltage may then be applied to one of the first row 15a and the second row 15b of the DUT structures 10a, 10b, 10c, 10d, 10e, and 10f. The force voltage may be applied to the test structure 100a through the voltage pad 35, wherein the row 15a, 15b that the force voltage is applied to may be selected with a decoder 30 that activates one of the first row switch 25a or the second row switch 25b, in step 120 of the method sequence depicted in FIG. 3. More specifically, when the force voltage is applied to the first row 15a, the decoder 30 sends a signal to set first row switch 25a to "on", and the second row switch 25b to "off", thereby connecting the first row 15a to the voltage pad 35 and disconnecting the second row 15b from the voltage pad 35. When the force voltage is applied to the second row 15b, the decoder 30 sends a signal to set first row switch 25a to "off", and the at least the second row switch 25b to "on", thereby connecting the second row 15b to the voltage pad 35 and disconnecting the first row 15b from the voltage pad 35. In one embodiment, the force voltage ranges from 0.5 volts to 5.0 volts. In another embodiment, the force voltage ranges from 0.5 volts to 2.0 volts.

Referring to step 130 of FIG. 3, once the force voltage is applied to the selected row 15a, 15b, a current is measured through the row 15a, 15b of DUT structures 10a, 10b, 10c, 10d, 10e, 10f that the force voltage is being applied to. For example, an ammeter may be connected across the successive DUT structures in a single row. In one example, the current through the selected row, e.g., first row 15a or second row 15b, across which the voltage is being forced is measured with an ammeter from the sense pads 20a, 20d of the first and the last test pad structure. Because, the DUT structures 10a, 10b, 10c in the first row 15a are connected in series, and the DUT structures 10d, 10e, 10f in the second row 15b are connected in series, a measurement of the current through the selected row 15a, 15b that the force voltage is being applied to will be equal to the current through each of the DUT structures 10a, 10b, 10c, 10d, 10e, 10f that are present in the row 15a, 15b that the force voltage is being applied. In one embodiment, the current measured through the row 15a, 15b that the force voltage is applied to ranges from 1 µA to 500 µA. In another embodiment, the current measured through the row 15a, 15b that the force voltage is applied to ranges from 5 µA to 50 µA.

In a following step 140 of one embodiment of the present method, a test voltage may then be simultaneously measured for each of the device under test (DUT) structures in the first row 15a or the at least the second row 15b of the DUT structures 10a, 10b, 10c, 10d, 10e, 10f that the force voltage is applied to from the sense pads 20a, 20b, 20c, 20d of the two of the plurality of test measurement structures that are in electrical communication to each DUT structure 10a, 10b, 10c, 10d, 10e, 10f in each of the first row 15a and the at least the second row 15b that the force voltage is being applied to. The test voltage is a measurement of voltage across the DUT structures 10a, 10b, 10c, 10d, 10e, 10f that the force voltage is being applied to.

By "simultaneous" it is meant that the voltage across each DUT structure 10a, 10b, 10c, 10d, 10e, 10f, in a selected row 15a, 15b is measured at the same time from the sense pads 20a, 20b, 20c, and 20d. Referring to FIG. 1a, when the force voltage is applied to the first row 15a, a test voltage may be measured across the first DUT structure 10a from the first sense pad 20a and the second sense pad 20b. When the force voltage is applied to the first row, a test voltage may be measured across the second DUT structure 10b from the second sense pad 20b and the third sense pad 20c. Further, when the force voltage is applied to the first row 15a, a test voltage may be measured across the third DUT structure 10c from the third sense pad 20c and the fourth sense pad 20d. The measurements of the DUT structures 10a, 10b, 10c, in the first row 15a may be conducted simultaneously by a four terminal measurement that contacts each of the sense pads 20a, 20b, 20c, 20d, at the same time. To dictate that the test voltage is being measured from the DUT structures 10a, 10b, 10c, in the first row 15a, and not the DUT structures 10e, 10d, 10f in the second row 15b, the decoder 30 sets the first test switches 45a, 45b, 45c, 45d to "on" and the second test switches 45e, 45f, 45g, 45h to "off".

Following the measurement of the test voltage across each of the DUT structures 10a, 10b, 10c, in the first row 15b, the decoder 30 may select the second row 15b, and the test voltage of the DUT structures 10d, 10e, 10f may then be measured, in step 150 of FIG. 3. To measure the test voltage across each of the DUT structures 10d, 10e, 10f in the second row 15b, the decoder 30 sets the first row switch 25a to "off", the second row switch 25b to "on", the first test switches 45a, 45b, 45c, 45d to "off", and the second test switches 45e, 45f, 45g, 45h to "on". As noted above, the 2-dimensional array may have any number of rows of DUT structures. Therefore, after measuring the test voltage of the second row 15b of DUT structures 10d, 10c, 10e, the test voltage of any additional row of DUT structures, such as third, fourth, fifth and up to and greater than a fifteen row of DUT structures, may be measured in a similar manner as the DUT structures 10a, 10b, 10c in the first and second row 15a, 15b.

Once the test voltage and the current for each of the DUT structures 10a, 10b, 10c, 10d, 10e, 10f has been determined the resistance of each of the DUT structures 10a, 10b, 10c, 10d, 10e, 10f may be calculated in step 160 in FIG. 3. For example, the resistance of each DUT structure 10a, 10b, 10c, 10d, 10e, 10f may be measured using ohms law. The 2-dimensional array of DUT structures 10a, 10b, 10c, 10d, 10e, 10f is functional if one or more of the DUTs 10a, 10b, 10c, 10d, 10e, 10f are shorted, and the location of the failing DUT structure 10a, 10b, 10c, 10d, 10e, 10f can be determined from the test voltage measurements. A row is disabled if a DUT structure 10a, 10b, 10c, 10d, 10e, 10f is open. In this case, localization of the defective DUT structure 10a, 10b, 10c, 10d, 10e, 10f can again be determined from voltage sense measurements.

Resistances of certain DUT structures 10a, 10b, 10c, 10d, 10e, 10f measured in accordance with the present disclosure may range from 2Ω to 10000Ω. In another example, resistance for DUT structures 10a, 10b, 10c, 10d, 10e, 10f may be characterized as a resistance ranging from 1Ω to 100Ω.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A structure for testing a 2-dimensional array of electrical devices comprising:
   a first row of device under test (DUT) structures and at least a second row of DUT structures, wherein the DUT structures of the first row are connected in series and the DUT structures of said at least the second row are connected in series;
   a first row switch in electrical communication to the first row of DUT structures, and at least a second row switch in electric communication to the at least the second row of DUT structures;
   two voltage pads for applying a force voltage, wherein electrical communication of the two voltage pads to the first row of DUT structures is through the first row switch and electrical communication of the two voltage pads to the at least the second row of DUT structures is through the at least the second row switch, wherein the force voltage, when applied through the first row switch, is across the series connection of the DUT structures of the first row and wherein the force voltage, when applied through the second row switch, is across the series connection of the DUT structures of the second row; and
   a plurality of test pad structures, wherein each set of two test pad structures in said plurality of test pad structures is in switchable parallel connection to a DUT structure in the first row of DUT structures and at least the second row of DUT structures, wherein the switchable parallel connection of the set of two test pad structures to the DUT structure is to measure a voltage across the DUT structure.

2. The structure of claim 1, wherein each of the plurality of test pad structures comprises a first test switch in electrical communication with a DUT structure in the first row of DUT structures, at least a second test switch in electrical communication with a DUT structure in the at least the second row of DUT structures, and a sense pad in electrical communication with the first test switch and the at least the second test switch.

3. The structure of claim 2, further comprising a decoder in electrical communication with at least one of the first row switch, the first test switch, the at least the second row switch and the at least the second test switch, wherein the decoder provides an activation signal to select a row to which the force voltage is applied and to select the row containing said each DUT from which a test measurement is taken.

4. The structure of claim 2, further comprising dedicated pads in electrical communication with at least one of the first row switch, the first test switch, the at least the second row switch, and the at least the second test switch, wherein an activation signal is applied to the dedicated pads to select a row to which the force voltage is applied and to select the row containing said each DUT from which a test measurement is taken.

5. The structure of claim 1, wherein a number and positioning of the DUT structures in the first row of the DUT structures mirrors a number and positioning of the DUT structures in the at least the second row of the DUT structures.

6. The structure of claim 1, wherein the 2-dimensional array of electrical devices is entirely present in a first metal level (M1).

7. The structure of claim 1, wherein the first row of DUT structures and the at least the second row of DUT structures are present in the scribe line.

8. The structure of claim 1, wherein the DUT structures comprises an electrical device selected from the group consisting of metal wires, contacts, via structures, doped semiconductor regions, and combinations thereof.

9. The structure of claim 1, wherein the first row switch, the at least the second row switch, or a combination of the first row switch and the at least the second row switch comprises a transistor.

10. The structure of claim 2, wherein the first test switch, the at least the second test switch, or a combination of the first test switch and the at least the second test switch comprises a transistor.

11. The structure of claim 1, wherein the at least the second row of DUT structures comprises up to 70 rows of DUT structures, and wherein the at least the second row switch comprises up to 70 row switches corresponding to each row of DUT structures.

12. A method for testing a 2-dimensional array of electrical devices including at least a first row of device under test (DUT) structures and at least a second row of DUT structures, wherein said DUT structures of the first row are connected in series and the DUT structures of the second row are connected in series, the method including:
   electrically contacting each of the DUT structures in said first row and said at least the second row of DUT structures with a plurality of test pad structures that provide for a switchable parallel measurement across each of the DUT structures in said first row or said at least the second row of DUT structures;
   applying a force voltage across one of the first row and the at least the second row of the DUT structures, wherein the force voltage, when applied across the first row, is across the series connection of the DUT structures of the first row and wherein the force voltage, when applied across the second row, is across the series connection of the DUT structures of the second row;

measuring a current through one of the first row or at least the second row of the DUT structures that the force voltage is being applied to; and simultaneously measuring a test voltage across each of the DUT structures in the first row or the at least the second row of the DUT structures that the force voltage is applied to from a set of two test pad structures in electrical communication to each DUT structure in said first row and said at least the second row of DUT structures that the force voltage is being applied to.

13. The method of claim 12, wherein a resistance for each DUT structure is calculated from the test voltage and the current.

14. The method of claim 12, wherein each of test pad structures in the set of two test pad structures comprises a first test switch to said each DUT structure in the first row and at least a second test switch to said each DUT structure in the at least the second row, wherein said each of the test pad structures in the set of two test pad structures further includes a sense pad in electrical communication to the first test switch and the second test switch.

15. The method of claim 12, wherein the applying a force voltage to one of the first row and the at least the second row of the DUT structures comprises a decoder connected to a first row switch and a second row switch that is configured to select one of the first and the at least the second rows of the DUT structures.

16. The method of claim 12, wherein the applying the force voltage to one of the first row and the at least the second row of DUT structures comprises dedicated pads to a first row switch and dedicated pads to a second row switch.

17. The method of claim 14, wherein the simultaneously measuring of the test voltage across each of the DUT structures comprises selecting one of the first test switch and the at least the second test switch of each test pad structure in the set of test pad structures to said each DUT in the first row of DUT structures and the at least the second row of DUT structures with a decoder, wherein the first test switch or the at least the second test switch that is selected provides electrical communication between the sense pad of each of the test pad structures in said set of test pad structures to said each DUT structure in the first row of DUT structures or the at least the second row of the DUT structures that the force voltage is applied to.

18. The method of claim 14, wherein the simultaneously measuring of the test voltage across each of the DUT structures comprises selecting one of the first test switch and the at least the second test switch of each test pad structure in the set of test pad structures to said each DUT in the first row of DUT structures and the at least the second row of DUT structures using dedicated pads to the first test switch and the at least the second test switch, wherein the first test switch or the at least the second test switch that is selected provides electrical communication between the sense pad of each of the test pad structures in said set of test pad structures to said each DUT structure in the first row of DUT structures or the at least the second row of the DUT structures that the force voltage is applied to.

19. The method of claim 12, wherein the 2-dimensional array of electrical devices is present in a first metal level (M1).

20. The method of claim 12, wherein the first row of DUT structures and at least the second row of DUT structures are present in the scribe line.

\* \* \* \* \*